(12) United States Patent
Smith et al.

(10) Patent No.: US 10,731,247 B2
(45) Date of Patent: Aug. 4, 2020

(54) COATED ARTICLE

(71) Applicant: SILCOTEK CORP., Bellefonte, PA (US)

(72) Inventors: David A. Smith, Bellefonte, PA (US); James B. Mattzela, Port Matilda, PA (US); Paul H. Silvis, Port Matilda, PA (US); Gary A. Barone, State College, PA (US)

(73) Assignee: SILCOTEK CORP., Bellefonte, PA (US)

( * ) Notice: Subject to any disclaimer, the term of this patent is extended or adjusted under 35 U.S.C. 154(b) by 0 days.

(21) Appl. No.: 15/683,399

(22) Filed: Aug. 22, 2017

(65) Prior Publication Data

US 2019/0032201 A1    Jan. 31, 2019

Related U.S. Application Data

(60) Continuation-in-part of application No. 13/504,533, filed on Jun. 21, 2012, now Pat. No. 9,777,368, and
(Continued)

(51) Int. Cl.
*C23C 16/32*       (2006.01)
*C23C 16/56*       (2006.01)
(Continued)

(52) U.S. Cl.
CPC ............. *C23C 16/325* (2013.01); *C23C 8/10* (2013.01); *C23C 16/56* (2013.01); *B05D 1/60* (2013.01);
(Continued)

(58) Field of Classification Search
CPC ............................................. Y10T 428/31612
See application file for complete search history.

(56) References Cited

U.S. PATENT DOCUMENTS

| | | | |
|---|---|---|---|
| 4,173,661 | A | 11/1979 | Bourdon |
| 4,579,752 | A | 4/1986 | Dubois et al. |

(Continued)

FOREIGN PATENT DOCUMENTS

WO       2009032488 A1       3/2009

OTHER PUBLICATIONS

"Stainless Steel Surface Analysis," Keber et al., Advanced Materials & Processes, Nov. 2000. (Year: 2000).*

(Continued)

*Primary Examiner* — Ian A Rummel
(74) *Attorney, Agent, or Firm* — McNees, Wallace & Nurick LLC

(57) ABSTRACT

The present invention relates to a coated article. The coated article includes a first layer, a second layer, and a diffusion region between the first layer and the second layer. The first layer has a first atomic concentration of C, a first atomic concentration of Si, and a first atomic concentration of O. The second layer has a first atomic concentration of Fe, a first atomic concentration of Cr, and a first atomic concentration of Ni. The diffusion region has a second atomic concentration of the C, a second atomic concentration of the Si, a second atomic concentration of the O, a second atomic concentration of the Fe, a second atomic concentration of the Cr, and a second atomic concentration of the Ni. All of the atomic concentrations are based upon Auger Electron Spectroscopy.

20 Claims, 9 Drawing Sheets

US 10,731,247 B2

Page 2

Related U.S. Application Data a division of application No. PCT/US2010/054058, filed on Oct. 26, 2010.

(60) Provisional application No. 61/267,228, filed on Dec. 7, 2009, provisional application No. 61/255,237, filed on Oct. 27, 2009.

(51) Int. Cl.
  C23C 8/10 (2006.01)
  B05D 1/00 (2006.01)
(52) U.S. Cl.
  CPC ... *B05D 2202/15* (2013.01); *Y10T 428/24802* (2015.01)

(56) References Cited

U.S. PATENT DOCUMENTS

| | | | |
|---|---|---|---|
| 4,671,997 A | 6/1987 | Galasso et al. | |
| 4,714,632 A | 12/1987 | Cabrera et al. | |
| 4,741,964 A | 5/1988 | Haller | |
| 4,749,631 A | 6/1988 | Haluska et al. | |
| 4,753,856 A | 6/1988 | Haluska et al. | |
| 4,792,460 A | 12/1988 | Chu et al. | |
| 4,842,888 A | 6/1989 | Haluska et al. | |
| 5,052,339 A * | 10/1991 | Vakerlis | C23C 16/4558 118/723 E |
| 5,160,544 A | 11/1992 | Garg et al. | |
| 5,250,451 A | 10/1993 | Chouan | |
| 5,299,731 A | 4/1994 | Liyanage et al. | |
| 5,480,677 A | 1/1996 | Li et al. | |
| 5,481,135 A | 1/1996 | Chandra et al. | |
| 5,562,952 A | 10/1996 | Nakahigashi et al. | |
| 5,563,102 A | 10/1996 | Michael | |
| 5,818,071 A | 10/1998 | Loboda et al. | |
| 5,825,078 A | 10/1998 | Michael | |
| 6,159,871 A | 12/2000 | Loboda et al. | |
| 6,444,326 B1 | 9/2002 | Smith | |
| 6,472,076 B1 | 10/2002 | Hacker | |
| 6,511,760 B1 | 1/2003 | Barone et al. | |
| 6,531,398 B1 | 3/2003 | Gaillard et al. | |
| 6,593,655 B1 | 7/2003 | Loboda et al. | |
| 7,070,833 B2 | 7/2006 | Smith et al. | |
| 7,867,627 B2 | 1/2011 | Smith et al. | |
| 2004/0175579 A1 | 9/2004 | Smith et al. | |
| 2004/0191109 A1* | 9/2004 | Maziasz | C22C 38/001 420/45 |
| 2006/0216952 A1 | 9/2006 | Bhanap et al. | |
| 2007/0281448 A1 | 12/2007 | Chen et al. | |
| 2012/0251797 A1 | 10/2012 | Smith et al. | |
| 2013/0244025 A1 | 9/2013 | Smith et al. | |
| 2014/0370300 A1 | 12/2014 | Smith | |
| 2015/0030885 A1 | 1/2015 | Smith | |
| 2015/0283307 A1 | 10/2015 | Smith et al. | |

OTHER PUBLICATIONS

H.E. O'Neal and M.A. Ring, "Mechanism of the Thermal Decomposition of Dimethylsilane at Atmostpheric Pressures in the Gas Phase", Organometallics, American Chemical Society, vol. 7, No. 5, May 1988, pp. 1017-1025.

Shinohara M et al: "infrared study of carbon incorporation during chemical vapor deposition of SiC using methylsilanes", Applied Surface Science Elsevier Netherlands, vol. 175-176, May 15, 2001, pp. 591-596.

Narita et al: "Interpretation of initial stage of 3C-SiC growth on Si(100) using dimethylsilane", Applied Surface Science, Elsevier, Amsterdam, NL, vol. 252, No. 10, Mar. 15, 2006, pp. 3460-3465.

Vasin A V et al: "Light-emitting properties of amorphous Si:C:O:H layers fabricated by oxidation of carbon-rich a-Si: C:H films", Solid State Sciences, Elsevier, Paris, FR, vol. 11, No. 10, Oct. 1, 2009, pp. 1833-1837.

D.A. Smith, D. Shelow and G. Barone, "Instrument and Sampling Equipment Passivation Requirements to Meet Current Demands for Low-Level Sulfur Analysis," 2001, 37 pgs.

Fast Facts At-a-Glance Product Information from Restek, Silcosteel-UHV, Dramatically Reduce Outgassing in UHV Systems, www.restekcorp.com, 2001, 2 pgs.

Fast Facts At-a-Glance Product Information from Restek, Silcosteel-CR, Achieve Specialty Alloy Performance Using Austenitic Stainless Steels, www.restekcorp.com, 2004, 4 pgs.

D.A. Smith, G.B. Stidsen, B. Burger and D. Shelow, "The Containment and Transfer of Trace Sulfur Gases at Low-PPBV Levels," 2001, 37 pgs.

G.A. Barone, D.A. Smith and M. Higgins, "Anti-Corrosive and Anti-Coking Properties of Unique Surface Coatings for Metal Substrates in Petrochemical Service," www.restekcorp.com, obtained Feb. 2015, 19 pgs.

G.A. Barone, D.A. Smith and D. Shelow, "Advantages to Using Inert, Coated Components for Sampling & Measurement of Organo-Sulfur Compounds," www.restekcorp.com, obtained Feb. 2015, 17 pgs.

R.L. Firor and B.D. Quimby, "Dual-Channel Gas Chromatographic System for the Determination of Low-Level Sulfur in Hydrocarbon Gases," Agilent Technologies, Inc., Mar. 2003, 10 pgs.

R.L. Firor, "Use of GC/MSD for Determination of Volatile Sulfur: Application in Natural Gas Fuel Cell Systems and Other Gaseous Streams," Agilent Technologies, Inc., Nov. 2001, 10 pgs.

V. Pretorius and J.D. Du Toit, "Gas Chromatography in Glass and Fused Silica Capillary Columns: Deactivation of the Inner Surface Using Silicon Films," Journal of HRC & CC, 1981, 2 pgs.

D.A. Smith, M. Higgins and G. Barone, "Evaluation of System Surfaces in Low-Level Sulfur Analysis for the Petrochemical Industry," www.restekcorp.com, obtained Feb. 2015, 37 pgs.

G. Barone, D.Smith and M. Higgins, "Selection of Surface Coatings for Process Lines and Equipment Used in Corrosive and Reactive Streams", Analytical Solutions for Energy Optimization & Environmental Compliance, The 54th Annual Symposium of the Analysis Division, Apr. 2009, 17 pgs.

J. De Zeeuw, G. Barone and M. Higgins, "Comparing Surface Adsorption Effects During the Analysis of Mercury and Sulfur Containing Streams," www.restekcoatings.com, obtained Feb. 2015, 30 pgs.

G. Barone, D. Smith, M. Higgins and T. Neeme, "Study of Chemical and Physical Adsorption Properties of Moisture, Sulfur, and Mercury Streams Through a Variety of Tubing Substrates," ISA 53rd Analysis Division Symposium, 2008, 9 pgs.

D.A. Smith and J.B. Mattzela, The Deposition and Functionalization of Silicon-Based Materials to Prevent Surface Corrosion, Adsorption, Contamination and Catalytic Interactions, MS&T'09, Oct. 2009, 21 pgs.

W. Bertsch and V. Pretorius, "Deactivation of Metal Surfaces for Capillary Columns for GC by Deposition of Silicon," Journal of HRC&CC, 1982, 3 pgs.

G.G. Gerhab and A. Schuyler, "Highly Inert Sample Pathways," 1996, 16 pgs.

A. Schuyler, J.W. Stauffer, C.E. Loope and C.R. Vargo, "Highly Efficient and Inert Stainless Steel GC Columns: A Durable, Flexible Alternative to Fused Silica," Elsevier Science Publishers, 1992, 6 pgs.

G. Gerhab and A. Schuyler, "Efficient and Rapid GC Analysis With Rugged Metal Microbore Capillary Columns," www.restekcorp.com, obtained Feb. 2015, 18 pgs.

J. De Zeeuw, "Deactivation of Metal Surfaces: Applications in Gas Chromatography (GC) for the Past 15 Years," American Laboratory, Nov. 2012, 10 pgs.

\* cited by examiner

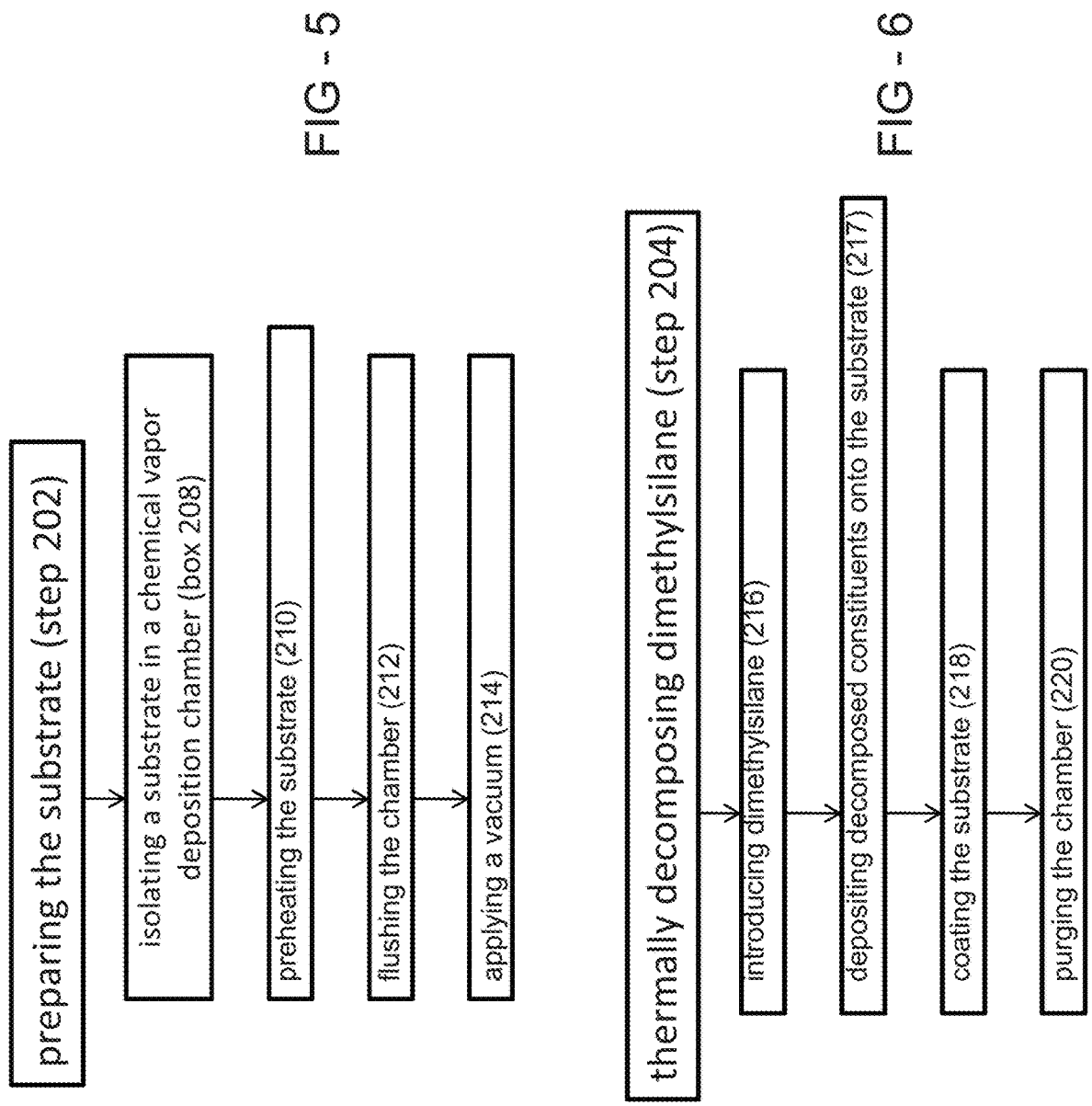

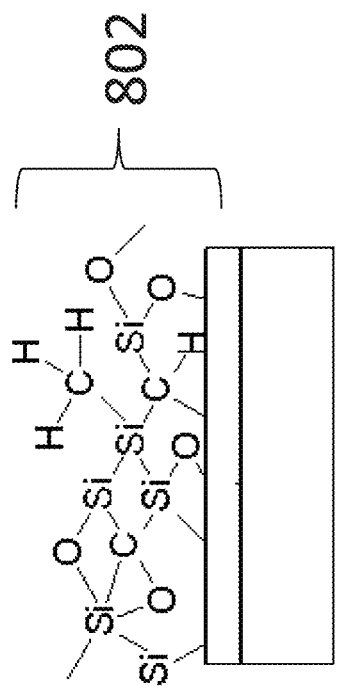 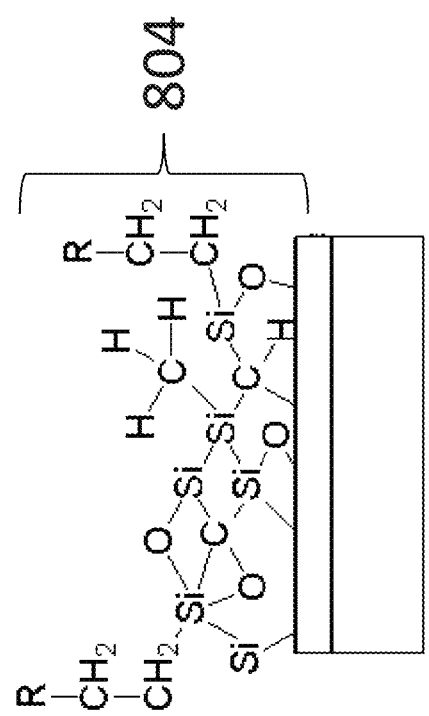
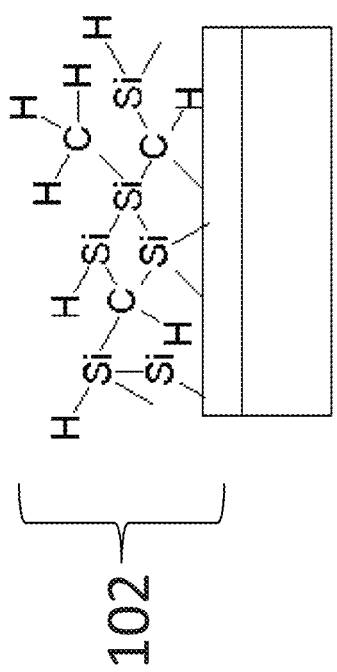 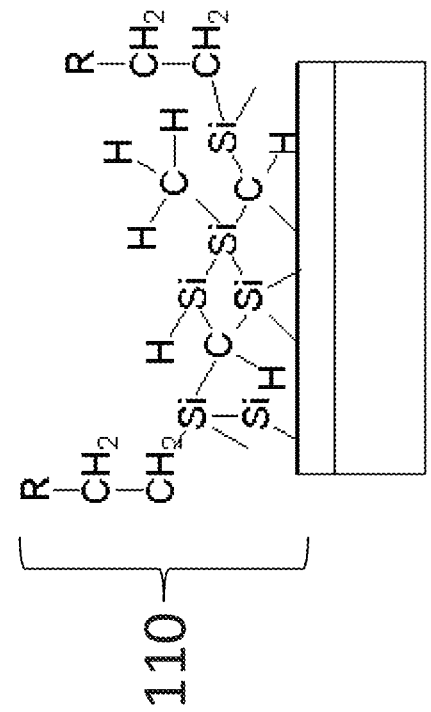
FIG - 8
FIG - 9

COATED ARTICLE

PRIORITY

The present application is a divisional application of U.S. Non-provisional patent application Ser. No. 13/504,533, filed Jun. 21, 2012 with the title "CHEMICAL VAPOR DEPOSITION COATING, ARTICLE, AND METHOD," which claims priority to and benefit of U.S. Provisional Patent Application No. 61/255,237, filed Oct. 27, 2009 with the title "DIMETHYLSILANE CHEMICAL VAPOR DEPOSITION COATING AND COATING PROCESS," U.S. Provisional Patent Application No. 61/267,228, filed Dec. 7, 2009 with the title "OXIDIZED VAPOR DEPOSITION COATING AND COATING PROCESS," and Patent Cooperation Treaty patent Application Number PCT/US2010/054058, filed Oct. 26, 2010 with the title "CHEMICAL VAPOR DEPOSITION COATING, ARTICLE, AND METHOD," all of which are hereby incorporated by reference in their entirety.

FIELD OF THE INVENTION

The present disclosure is directed to coated articles. More particularly, the disclosure is directed to coated articles having a coating with carbon, silicon, and oxygen.

BACKGROUND

Often, surfaces of substrates do not include desired performance characteristics. The failure to include specific desired performance characteristics can result in surface degradation in certain environments, an inability to meet certain performance requirements, or combinations thereof. For example, in certain environments, metallic, glass, and ceramic surfaces can be subjected to undesirable surface activities such as chemical adsorption, catalytic activity, corrosive attack, oxidation, byproduct accumulation or stiction, and/or other undesirable surface activities.

Undesirable surface activities can cause chemisorption of other molecules, reversible and irreversible physisorption of other molecules, catalytic reactivity with other molecules, attack from foreign species, a molecular breakdown of the surface, or combinations thereof.

A coating may be applied to protect a surface from undesirable surface activities. One known method of depositing a coating on a surface is chemical vapor deposition. Chemical vapor deposition deposits a solid material from a vapor under a controlled atmosphere and temperature conditions for a predetermined time to form a coating. Chemical vapor deposition can include a primary treatment followed by functionalization (a surface reaction) to add predetermined molecules.

To provide certain desired performance characteristics, an amorphous silicon hydride surface can be deposited and unsaturated hydrocarbon reagents can be reacted to modify the surface of a substrate. Amorphous silicon-based chemical vapor deposition materials, however, are susceptible to dissolution by caustic high pH media, thereby limiting their use. These materials are not wear resistant or hard enough for effective use in environments with impact or sliding wear. Additionally, the functionalization of silicon materials with unsaturated hydrocarbons often requires the use of a metal catalyst. Such processes suffer from the drawbacks that complete removal of this catalyst from the treated system is often difficult and the presence of the catalyst can reintroduce undesirable surface activity.

Molecules including silicon, carbon, and hydrogen have previously been considered undesirable for use as chemical vapor deposition precursors or have been applied in conjunction with other chemical vapor deposition precursors in the presence of additional depositional energies such as plasma and microwave fields. Thus, properties associated with such molecules have previously been unrealized through thermal chemical vapor deposition technology.

What is needed is a coating, an article, and a method that does not suffer from the drawbacks of the prior art.

SUMMARY OF THE INVENTION

An exemplary embodiment includes a coated article. The coated article includes a first layer, a second layer, and a diffusion region between the first layer and the second layer. The first layer has a first atomic concentration of C, a first atomic concentration of Si, and a first atomic concentration of O, wherein the first atomic concentration of the C is greater than the first atomic concentration of the O, and the first atomic concentration of the Si is greater than the first atomic concentration of the C. The second layer has a first atomic concentration of Fe, a first atomic concentration of Cr, and a first atomic concentration of Ni, wherein the first atomic concentration of the Fe is greater than the first atomic concentration of the Cr, and the first atomic concentration of the Cr is greater than the first atomic concentration of the Ni. The diffusion region has a second atomic concentration of the C, a second atomic concentration of the Si, a second atomic concentration of the O, a second atomic concentration of the Fe, a second atomic concentration of the Cr, and a second atomic concentration of the Ni, the second atomic concentration of the O being greater than the second atomic concentration of the C, the second atomic concentration of the Si, the second atomic concentration of the Fe, the second atomic concentration of the Cr, and the second atomic concentration of the Ni. All of the atomic concentrations are based upon Auger Electron Spectroscopy.

Another exemplary embodiment includes a coated article. The coated article includes a first layer, a second layer, and a diffusion region between the first layer and the second layer. The first layer has a first atomic concentration of C, a first atomic concentration of Si, and a first atomic concentration of O, wherein the first atomic concentration of the C is greater than the first atomic concentration of the O, and the first atomic concentration of the Si is greater than the first atomic concentration of the C. The second layer has a first atomic concentration of Fe, a first atomic concentration of Cr, and a first atomic concentration of Ni, wherein the first atomic concentration of the Fe is greater than the first atomic concentration of the Cr, and the first atomic concentration of the Cr is greater than the first atomic concentration of the Ni. The diffusion region has a second atomic concentration of the C, a second atomic concentration of the Si, a second atomic concentration of the O, a second atomic concentration of the Fe, a second atomic concentration of the Cr, and a second atomic concentration of the Ni, the second atomic concentration of the O being greater than the second atomic concentration of the C, the second atomic concentration of the Si, the second atomic concentration of the Fe, the second atomic concentration of the Cr, and the second atomic concentration of the Ni. The diffusion region is at least 5 nm in thickness. The first atomic concentration of the C is greater than 30, the first atomic concentration of the Si is greater than 30, the first atomic concentration of the O is less than 30, the second atomic concentration of the C is less than 30, the second atomic concentration of the Si is less than 35, and the second atomic concentration of the O is greater than 35. All of the atomic concentrations are based upon Auger Electron Spectroscopy.

Another exemplary embodiment includes a coated article. The coated article includes a first layer, a second layer, and a diffusion region between the first layer and the second layer. The first layer has a first atomic concentration of C, a first atomic concentration of Si, and a first atomic concentration of O. The second layer has a first atomic concentration of Fe, a first atomic concentration of Cr, and a first atomic concentration of Ni. The diffusion region has a second atomic concentration of the C, a second atomic concentration of the Si, a second atomic concentration of the O, a second atomic concentration of the Fe, a second atomic concentration of the Cr, and a second atomic concentration of the Ni. The first atomic concentration of the C is greater than 30, the first atomic concentration of the Si is greater than 30, the first atomic concentration of the O is less than 30, the second atomic concentration of the C is less than 30, the second atomic concentration of the Si is less than 35, and the second atomic concentration of the O is greater than 35. All of the atomic concentrations are based upon Auger Electron Spectroscopy.

An advantage of an embodiment is that previously unavailable molecules including silicon, carbon, and hydrogen can be applied to substrate surfaces.

Another advantage of an embodiment is that thermal chemical vapor deposition can be performed without additional decompositional energies, such as plasma and microwave energies, to assist in decomposition of dimethylsilane.

Another advantage of an embodiment is that the silicon, carbon, and hydrogen material is not susceptible to dissolution in high pH media.

Another advantage of an embodiment is that the oxidized materials display an improved wear resistant and hardness for improved use in environments with impact or sliding wear.

Another advantage of an embodiment is that use of an additional metal catalyst can be avoided in the formation of a coating including silicon, carbon, and hydrogen.

Another advantage of an embodiment is that residual catalyst activity is reduced or eliminated.

Another advantage of an embodiment is that steps for removal of catalyst can be eliminated.

Another advantage of an embodiment is the use of a non-pyrophoric substance that can improve safety.

Further aspects of embodiments of the invention are disclosed herein. The features as discussed above, as well as other features and advantages of the present application, will be appreciated and understood by those skilled in the art from the following drawings and detailed description.

BRIEF DESCRIPTION OF THE DRAWINGS

FIG. 5 shows an exemplary treatment method in a chemical vapor deposition method according to the disclosure.

FIG. 6 shows an exemplary thermal decomposition in a chemical vapor deposition method according to the disclosure.

FIG. 8 shows an exemplary oxidation process in a chemical vapor deposition method according to an embodiment of the disclosure.

FIG. 9 shows an exemplary water oxidation process in a chemical vapor deposition method according to an embodiment of the disclosure.

Wherever possible, the same reference numbers will be used throughout the drawings to represent the same parts.

DETAILED DESCRIPTION

Provided is chemical vapor deposition coating, a chemical vapor deposition article, and a method of chemical vapor deposition that do not suffer from drawbacks of the prior art. For example, embodiments of the coating, article, and method can utilize molecules including silicon, carbon, and hydrogen. In one embodiment, the method can be employed without an additional metal catalyst, devoid of additional residual catalyst activity, and combinations thereof. In one embodiment, the method increases hardness without substantially reducing inertness, chemical corrosive resistance, and/or other desirable properties. Exemplary coatings formed according to the disclosure can modify functionality, inertness, tailorability, hydrophobicity, anti-corrosive and/or anti-stiction behavior, hardness, wear resistance, or combinations thereof.

Figure 1:
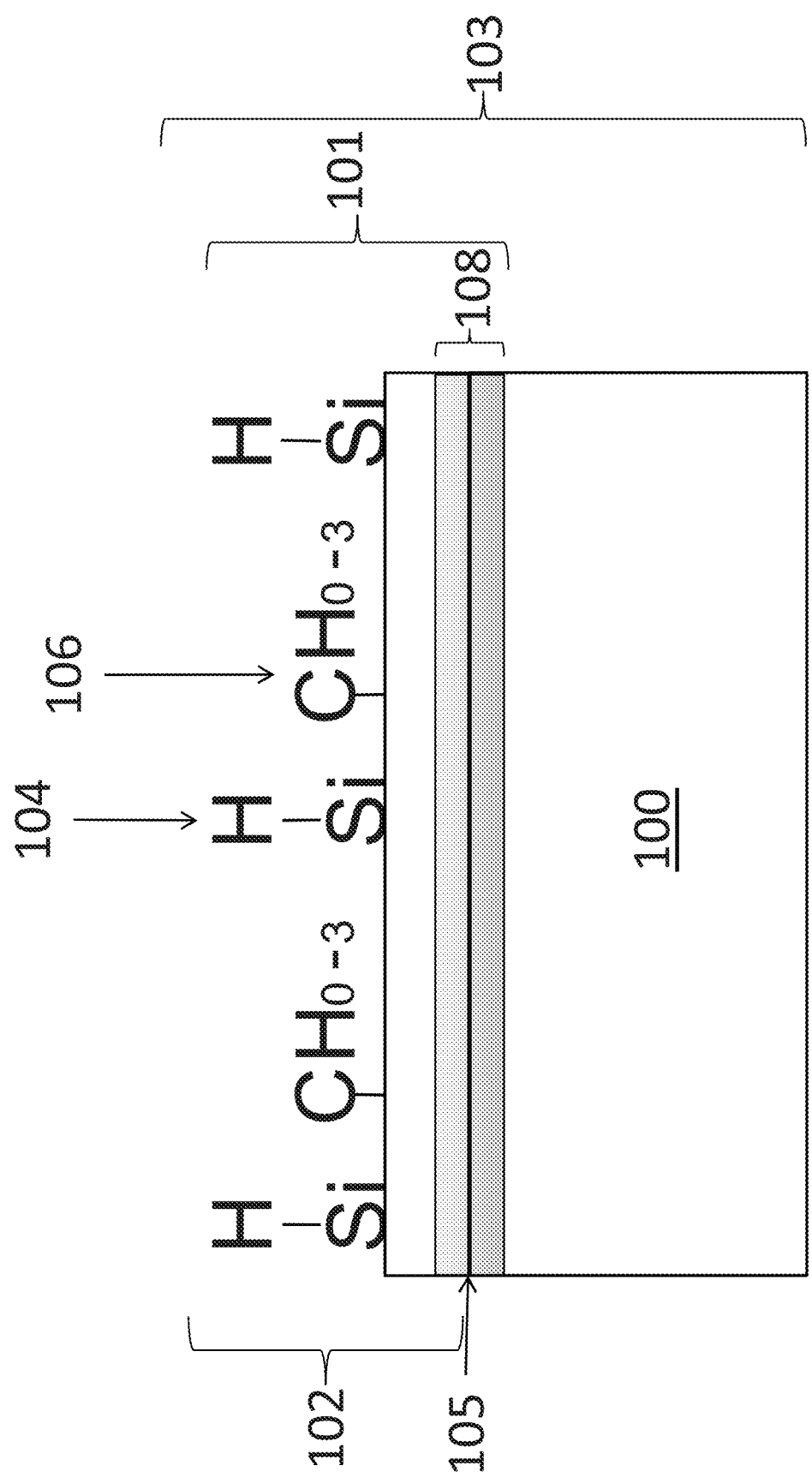
FIG. 1 shows an exemplary embodiment of a carbosilane coating on a substrate according to the disclosure.

Referring to FIG. 1, a substrate 100 according to an exemplary embodiment can include a surface 105 having improved surface properties achieved by controllably depositing a layer 102 that imparts a desired surface effect to the substrate 100, a coating 101, an article 103, or combinations thereof. The coating 101 is formed by chemical vapor deposition (for example, decomposition of dimethylsilane to form a carbosilane) followed by oxidation (for example, air-oxidation to form a carboxysilane) and/or functionalization (for example, between a hydrosilane and an unsaturated hydrocarbon to form a functionalized carboxysilane).

The imparting of the desired surface effect can improve performance of the surface 105 by diffusion of the layer 102 and/or the coating 101 into the surface 105 of the substrate 100. The layer 102 can be applied to any suitable substrate. For example, the substrate 100 can be a metallic substrate (ferrous or non-ferrous), a glass substrate, or a ceramic substrate.

In an exemplary embodiment, the layer 102 is formed by thermal decomposition of dimethylsilane. By thermally decomposing dimethylsilane, the layer 102 includes molecules including silicon, carbon, and hydrogen atoms that can be active sites. These molecules within the layer 102 can include a first portion 104 and a second portion 106. Generally, the first portion 104 and the second portion 106 are not spatially resolvable (for example, the first portion 104 and the second portion 106 are defined by the molecules deposited on the layer 102 and the molecules may be interspersed throughout the layer 102). Furthermore, use of the terms "first" and "second" is not intended to imply any sequentiality, difference in quantity, difference in size, or other distinction between the two portions. To the contrary, the terms "first" and "second" are used for distinguishing molecular composition of the two portions. For example, in one embodiment, the first portion 104 includes silicon and the second portion 106 includes carbon. In one embodiment, the first portion 104 and the second portion 106 are bound together randomly throughout the layer 102.

Figure 2:
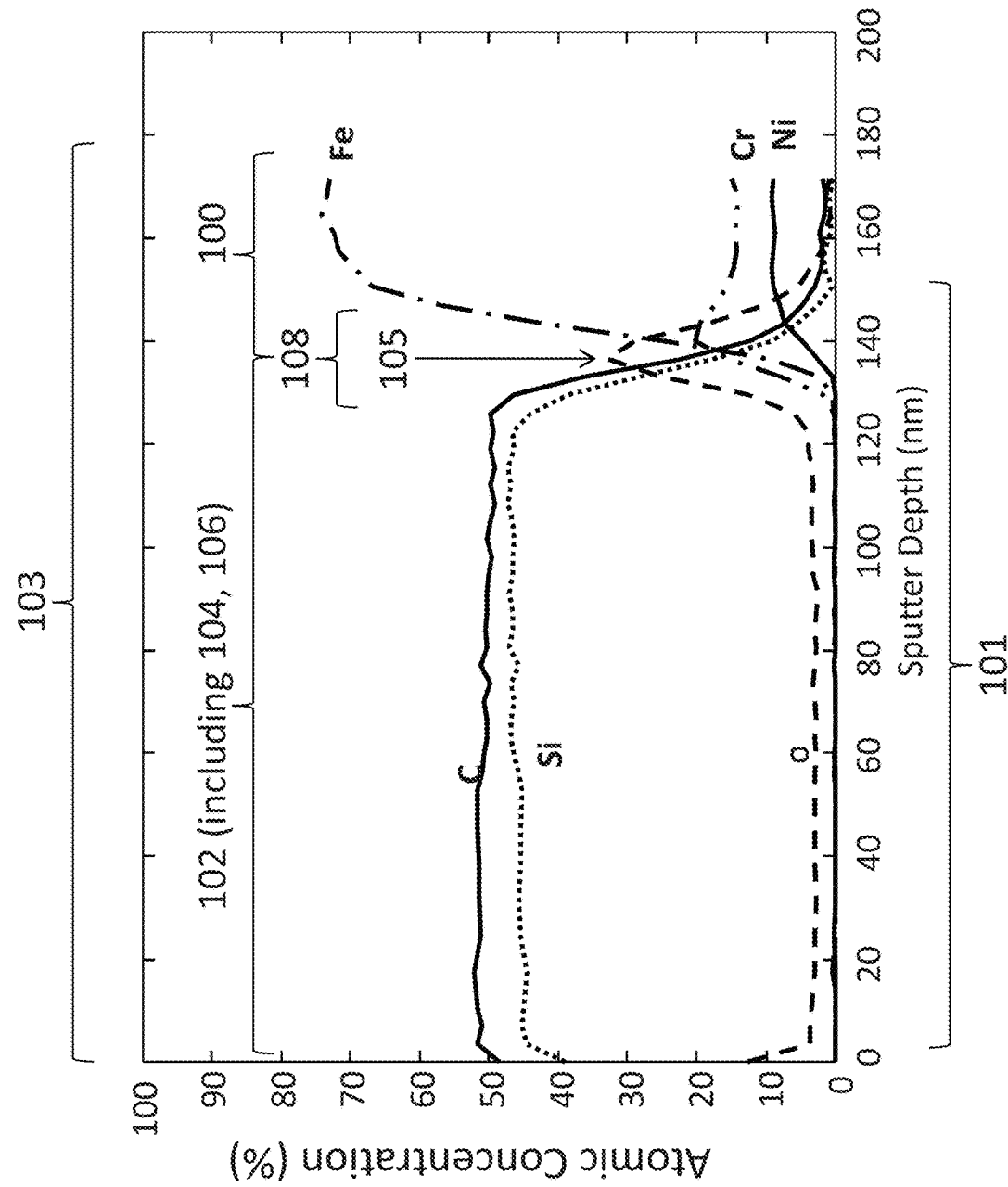
FIG. 2 shows an Auger Electron Spectroscopy plot for an exemplary embodiment of a carbosilane coating having a layer on a substrate according to the disclosure.

FIG. 2 illustrates diffusion of the layer 102 and/or the coating 101 into the substrate 100 according to an exemplary embodiment. Applying dimethylsilane to preselected surfaces has resulted in improved chemical resistance, improved inertness, and improved adhesion over non-diffusion coatings. FIG. 2 corresponds to the layer 102 having the first portion 104 with carbon and the second portion 106 having silicon. Specifically, FIG. 2 shows the composition of the layer 102 within the substrate 100 and/or the article 103 by Auger Electron Spectroscopy measurements of the layer 102.

In one embodiment, dimethylsilane is thermally decomposed and deposited as amorphous carbosilane for 15 hours. In this embodiment, the layer 102 extends to about 130 nanometers and includes a portion of the diffusion region 108 identifiable based upon an increased concentration of O and decreased in concentration of C and Si (for example, by at least a factor of four). The range of the layer 102 can be between about 0.1 micrometers to about 3.0 micrometers. The diffusion region 108 can be between about 5 nanometers and 500 nanometers. In one embodiment, the diffusion region 108 is about 20 nanometers. The composition of layer 102 is about 1:0.95:0.12 ratio of C:Si:O (the small presence of oxygen from a depth of 5 nanometers to 120 nanometers is likely attributed to background noise and trace contamination). In contrast, the composition of dimethylsilane introduced into the chemical vapor deposition chamber has about a 2:1 ratio of C:Si. It is believed that $CH_x$ (x=0-3) moieties are retained and Si—C bonds are broken thus indicating that layer 102 includes an amorphous array of Si—C bonding and/or a polycrystalline microstructure. The amorphous array provides additional benefits such as decreased cracking or flaking (for example, upon tensile or compressive forces acting on the substrate 100) and/or increased adhesion. In one embodiment, multiple layers of the coating 101 or similar coatings are deposited for thicker layers or for desired properties.

Figure 3:
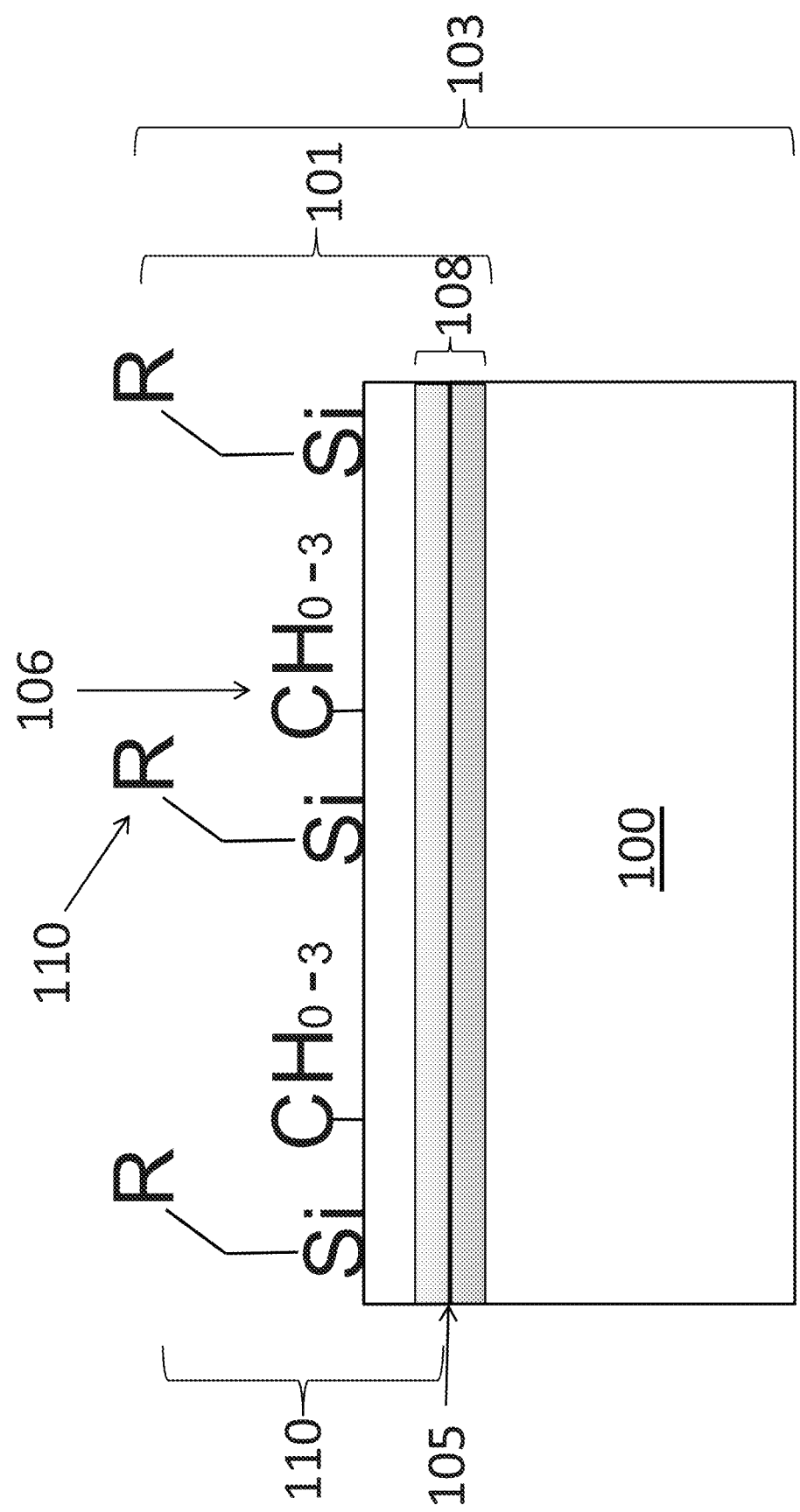
FIG. 3 shows an exemplary embodiment of a functionalized carbosilane coating on a substrate according to the disclosure.

FIG. 3 shows an exemplary embodiment having a functionalized layer 110. The functionalized layer 110 is formed by thermally reacting silicon hydride moieties with unsaturated hydrocarbons (for example, having the formula $H_2C=CH-R$ and/or $HC\equiv C-R$) and includes R-groups bonded to all or part of first portion 104 of the layer 102. R-groups can be formed by any suitable organic reagent having one or more unsaturated hydrocarbon groups. R-groups can be formed by hydrocarbons, substituted hydrocarbons (for example, halogenated), carbonyls, carboxyls, esters, amines, amides, sulfonic acids, organometallic complexes, and/or epoxides.

Figure 4:
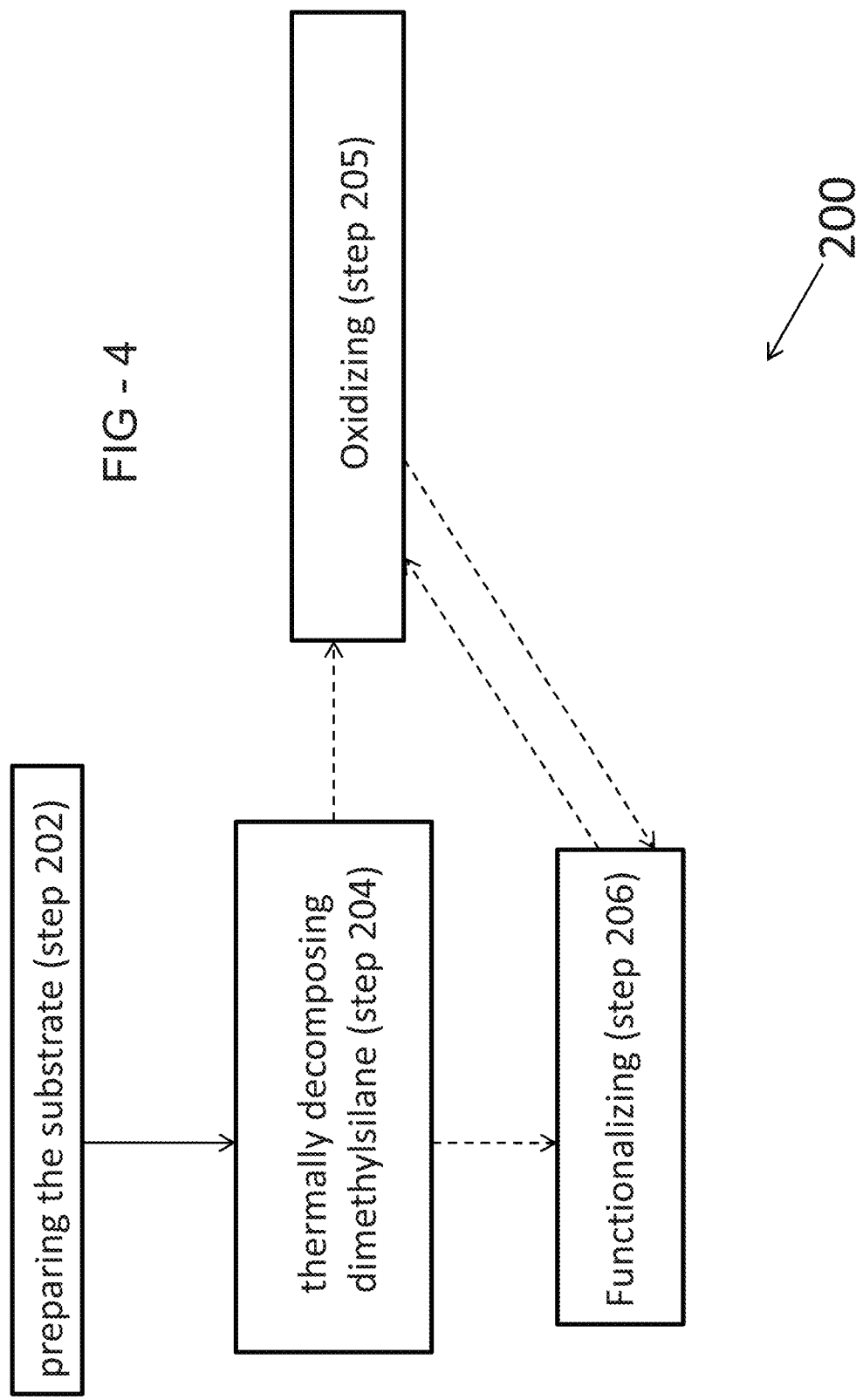
FIG. 4 shows a chemical vapor deposition method according to an exemplary embodiment of the disclosure.

FIG. 4 shows an exemplary chemical vapor deposition method 200 for forming the layer 102 that includes preparing the substrate (step 202) and thermally decomposing dimethylsilane (step 204). Preparing the substrate (step 202) can be performed by any suitable treatment method. For example, referring to FIG. 5, preparing the substrate (step 202) can include isolating a substrate in a chemical vapor deposition chamber (substep 208), preheating the substrate (substep 210), flushing the chamber (substep 212) with an inert gas, and evacuating the chamber (substep 214).

Isolating the substrate (substep 208) is performed in an inert atmosphere within the chamber. The flow of gas and/or maintenance of a vacuum in the chamber can provide the controlled atmosphere. A heat source can control the temperature in the chamber to desorb water and remove remaining contaminants from the substrate surface (substep 210). For example, the surface to be treated can be included within a chemical vapor deposition chamber with tubing connections to allow gas flow in and out of the chemical vapor deposition chamber. The chamber can include multiple controlled inlets and outlets configured for providing and removing multiple gas streams. A vacuum may be connected to one or more outlet tubes.

Depending upon the cleanliness of the substrate, the substrate may be prepared by heating (substep 210) at a temperature above about 100° C. at a pressure of below about 1 atmosphere for a period ranging from a few minutes to about 15 hours. Generally, the temperature of the heating corresponds to the properties of the substrate 100. In one embodiment, the period is from about 0.5 to about 15 hours. In another embodiment, the substrate is heated at about 450° C. for about 2 hours. After preparation under vacuum, the chamber may be selectively flushed (substep 212) with an inert gas and evacuated (substep 214).

Method 200 includes thermally decomposing the dimethylsilane (step 204). In general, dimethylsilane is not readily obtainable due to the low demand for it. Dimethylsilane has been regarded as undesirable in some chemical vapor deposition applications because it includes carbon. It has been found to produce lower wear resistance coatings when applied by conventional techniques, and is much more expensive than silane. Silane and the monomethyl analogue to dimethylsilane, methylsilane, are both pyrophoric and may explode in air. Dimethylsilane, although flammable, is not pyrophoric. Thus, use of dimethylsilane can decrease safety risks. In addition, use of dimethylsilane can result in inertness of a coating and/or chemical resistance, thereby protecting a surface of a substrate.

Referring to FIG. 6, thermal decomposition of dimethylsilane (step 204) includes introducing dimethylsilane (substep 216) into the chamber at a predetermined pressure and temperature sufficient to decompose dimethylsilane, depositing constituents from decomposition onto the substrate 100 (substep 217), coating the substrate (substep 218) for a predetermined period of time to achieve a predetermined thickness, and/or purging the chamber of dimethylsilane (substep 220). As is described in U.S. Pat. No. 6,444,326, which is incorporated herein by reference in its entirety, exemplary process conditions may include pressure being between about 0.01 p.s.i.a. to about 200 p.s.i.a. The temperature can be between about 200° and 600° C. The time period can be from about 10 minutes to about 24 hours.

In one embodiment, the dimethylsilane introduced (substep 216) includes dimethylsilane in gaseous form. In one embodiment, the substrate is exposed to dimethylsilane gas at a pressure between about 1.0 p.s.i.a. and about 100 p.s.i.a. and a temperature between about 300° and 600° C. for a time of about 30 minutes to about 24 hours. In an exemplary embodiment, the substrate 100 is exposed to dimethylsilane gas at a temperature between about 400° and about 500° C. for about 15 hours. The pressure of the dimethylsilane gas may be between about 5 p.s.i.a. and about 40 p.s.i.a.

The dimethylsilane is then thermally dissociated into molecular fragments including H, C, Si, and combinations thereof, and the constituents are deposited onto the substrate 100 (substep 217), thereby forming the coating 102 (substep 218) with a material including silicon, carbon, and hydrogen resulting from decomposition of dimethylsilane. Dimethylsilane gas may be introduced into the reaction chamber under reduced pressure or with an inert gas, such as nitrogen, helium, and/or argon, as a partial pressure dilutant. Although not intending to be bound by theory, it is believed that the dimethylsilane thermally decomposes to form carbosilyl fragments, which recombine and bind to the substrate surface. It is believed that the resultant coating includes amorphous carbosilanes having carbon, silicon, and hydrogen on the substrate surface as well as on exposed surfaces of the chamber. The deposited material also diffuses into the surface 105 of the substrate 100 as is illustrated in the Auger Electron Spectroscopy depth profile (FIG. 2, the diffusion region 108) thus supporting the mode of adhesion to the substrate 100. The chamber may then be purged of dimethylsilane and volatile, non-deposited carbosilyl fragments (substep 220). If a thicker deposition layer is desired, deposition conditions are changed. This is accomplished by changing temperature, pressure, time, or combinations thereof. Multiple layers can also be applied by repeating step 204.

Upon the layer 102 (as further described with reference in FIGS. 1 and 2) being formed, additional steps may be performed. In one embodiment, the layer 102 is functionalized next (step 206), as further described below with reference to FIG. 7 to form the functionalized layer 110. In one embodiment, the layer 102 (for example, amorphous carbosilane) is oxidized (step 205), as further described below with reference to FIG. 8 to form an oxidized layer 802 (for example, amorphous carboxysilane). In one embodiment, the functionalized layer 110 (for example, functionalized amorphous carbosilane) is oxidized to form a functionalized then oxidized layer 804 (for example, functionalized amorphous carboxysilane), as further described below with reference to FIG. 9. In one embodiment, the oxidized layer 802 is functionalized.

Figure 7:
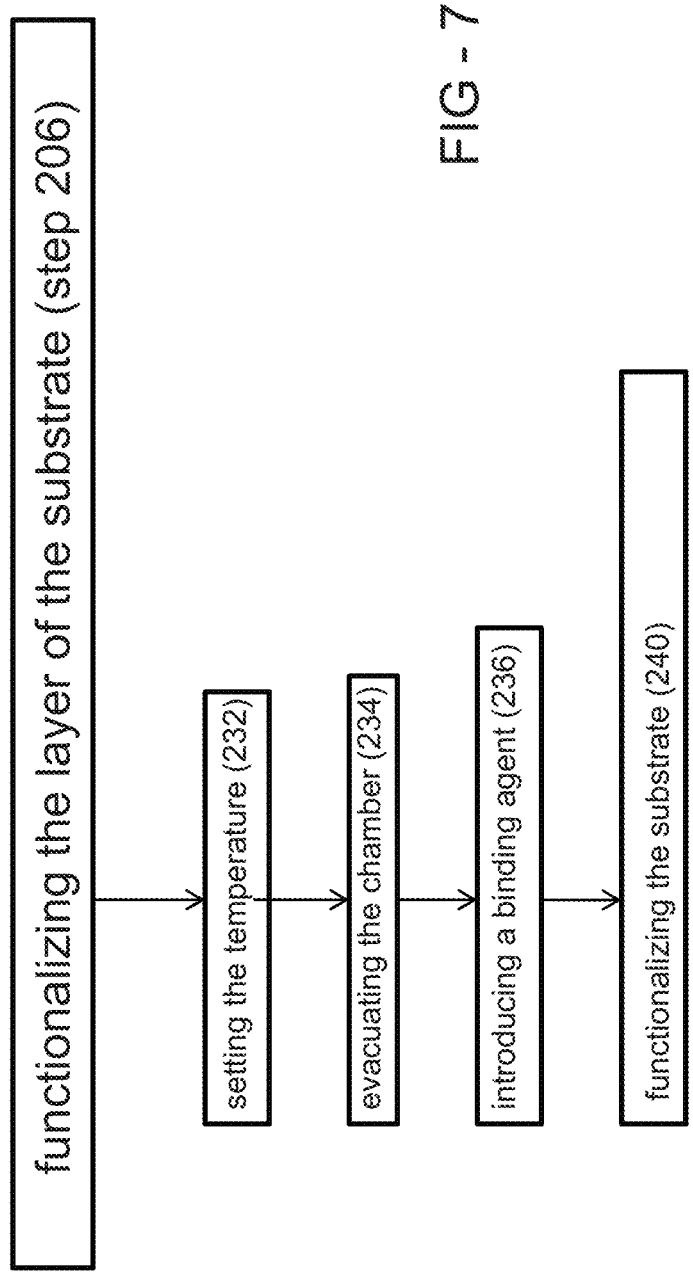
FIG. 7 shows an exemplary functionalization step in a chemical vapor deposition method according to the disclosure.

In one embodiment, the method 200 further includes functionalizing the layer 102 of the substrate 100 (step 206) to form the functionalized layer 110, as briefly discussed above with reference to FIG. 3. Referring to FIG. 7, functionalizing the layer 102 of the substrate 100 (step 206) may be performed by reacting with silicon hydride moieties remaining from the original carbosilane deposition (step 204). Following the carbosilane deposition on the substrate (step 204), the system is purged with an inert gas (which can be the purging of substep 220 or a separate purge step) while the reaction chamber can be set to a predetermined functionalization temperature (substep 232). The purge removes gaseous carbosilane moieties and/or unreacted dimethlysilane moieties not bound to the substrate surface. After the purge and setting of the temperature (substep 232), the chamber is evacuated (substep 234).

Next, a binding agent is introduced into the chamber at a predetermined temperature and pressure within the chamber (substep 236). In one embodiment, with heat as a driving force, the binding reagent reacts with and binds to the carbosilyl surface via silicon hydride moieties. Binding agent examples are ethylene, propylene, and substituted unsaturated organic molecules. Residual moieties of the silicon hydride may be reacted under heat (for example, at about 400° C.) with $H_2C=CH-R$ and/or $HC\equiv C-R$. The R-groups can be formed by hydrocarbons, substituted hydrocarbons (for example, halogenated), carbonyls, carboxyls, esters, amines, amides, sulfonic acids, organometallic complexes, and/or epoxides.

In one embodiment, binding agent molecules are then bound to the substrate (substep 240). The coating can include a carbon-silicon covalent bond with an R-group. The R-group can be modified to adjust the properties of the surface. For example, the R-group can be modified to adjust the hydrophobicity of the surface. To adjust the hydrophobicity of the surface, the R-group can be a fluorinated hydrocarbon. The fluorinated hydrocarbon can form a hydrophobic and/or oleophobic surface. Additionally or alternatively, the R-group can include an organometallic substituent providing catalytic or biocidal properties. Although not intending to be bound by theory, it is believed that the moieties of silicon hydride can thermally react, via a hydrosilyation mechanism, with unsaturated hydrocarbon groups to covalently bond to the surface of the coated substrate. The resultant coating on all exposed surface within the reaction chamber includes covalently-bound R-groups which includes the R-group and carbon, silicon, and hydrogen moieties.

In one embodiment, method 200 further includes oxidizing the layer 102 of the substrate 100 (step 205) to form the oxidized layer 802, as briefly described above with reference to FIG. 3. In another embodiment, the functionalized layer 110 is oxidized. Layer 102 is oxidized by exposure to any suitable chemical species capable of donating a reactive oxygen species into layer 102 under predetermined oxidation conditions. For example, the chemical species may be water, oxygen, air, nitrous oxide, ozone, peroxide, and combinations thereof. In general, oxidation is a bulk reaction that affects the bulk of the coating 101. The oxidation may be controlled by increasing or decreasing the temperature within the chamber, the exposure time within the chamber, the type and/or amount of diluent gases, pressure, and/or other suitable process conditions. Control of the oxidation can increase or decrease the amount and/or depth of oxidation and, thus, the wear resistance and/or hardness of the surface. In one embodiment, the layer 102 is exposed to water (for example, in an inert gas at a pressure of about 100 to 200 p.s.i.a. at about 450° C. for about two hours). In one embodiment, the functionalized layer 110 is exposed to water (for example, in an inert gas at a pressure of about 100 to 200 p.s.i.a. at about 450° C. for about two hours).

The oxidation improves hardness and/or wear resistance of carbosilane and functionalized carbosilane-based chemical vapor deposition process materials on ferrous metallic surfaces, non-ferrous metallic surfaces, and/or glass surfaces by controlled oxidation. In one embodiment, referring to FIG. 8, the layer 102 is an amorphous layer of carbosilane that is oxidized to form an amorphous layer of carboxysilane as the oxidized layer 802. In one embodiment, referring to FIG. 9, the functionalized layer 110 is an amorphous layer of functionalized carbosilane that is oxidized to form an amorphous surface of functionalized carbosilane that is oxidized to form an amorphous surface of functionalized carboxysilane as the oxidized layer 802.

In one embodiment, the oxidizing (step 205) is performed with nitrous oxide ($N_2O$). Specifically, $N_2O$ is applied under heat (for example, about 450° C.) with a pressure of substantially pure $N_2O$ in a vessel with carbosilane-coated samples. In this embodiment, the oxidizing (step 205) over-oxidizes and the over-oxidizing results in having a contact angle of about 60°, increases an amount of N—H, Si—OH, and/or C—OH groups, and results in having relatively fragile scratch resistance.

In one embodiment, the oxidizing (step 205) is performed with ozone. In this embodiment, the oxidizing (step 205) is believed to decrease wear resistance, decrease chemical resistance, decrease scratch resistance, decrease hardness, and increase acid resistance/corrosion resistance.

In one embodiment, the oxidized layer 802 is formed with water (only) as an oxidizing reagent (for example, within a temperature range of about 100° C. to about 600° C., a temperature range of about 300° C. to about 600° C., or at a temperature of about 450° C.). In this embodiment, the oxidizing (step 205) results in having a contact angle on a Si wafer of about 86.6°, lowers friction (in comparison to using an oxidizing reagent of air and water), decreases wear resistance (for example, in comparison to using an oxidizing reagent of air and water), and forms Si—O—Si groups.

In another embodiment, the oxidized layer 802 is formed with an oxidizing reagent including air and water (for example, within a temperature range of about 100° C. to about 600° C., a temperature range of about 300° C. to about 600° C., or at a temperature of about 450° C.). In this embodiment, oxidizing (step 205) over-oxidizes and decreases an amount of C—H groups (for example, in comparison to using water alone as an oxidizing reagent), decreases an amount of Si—C groups (for example, in comparison to using water alone as an oxidizing reagent), and increases an amount of Si—OH/C—OH groups (for example, in comparison to using water alone as an oxidizing reagent).

In another embodiment, the oxidized layer 802 is formed with air (only) (for example, within a temperature range of about 100° C. to about 600° C., a temperature range of about 300° C. to about 600° C., or at a temperature of about 450° C.). In this embodiment, oxidizing (step 205) lowers friction, increases wear resistance (for example, in comparison to using an oxidizing reagent of water), and forms Si—O—Si and Si—OH groups.

In one embodiment, the layer 102 has a predetermined contact angle (for example, about 98.3° advancing) and the functionalized layer 110 has a higher contact angle (for example, about 100° advancing). In one embodiment, the layer 102 has a predetermined contact angle (for example, about 95.6° advancing) and a functionalized then oxidized layer 804 has a lower contact angle (for example, about 65.9° receding). In this embodiment, the oxidizing (step 205) forms Si—O—Si groups decreasing an amount of Si—H groups (for example, in comparison to the functionalized layer 110).

In one embodiment, the layer 802 has a lower coefficient of friction (for example, about 0.84) than a higher coefficient of friction (for example, about 0.97) for the layer 102. Similarly, in one embodiment, the oxidized layer 802 has a lower wear rate (for example, about 6.75 E-05 mm$^3$/N/m) than a higher wear rate (for example, 4.73 E-04 mm$^3$/N/m) for the layer 102.

Figure 11:
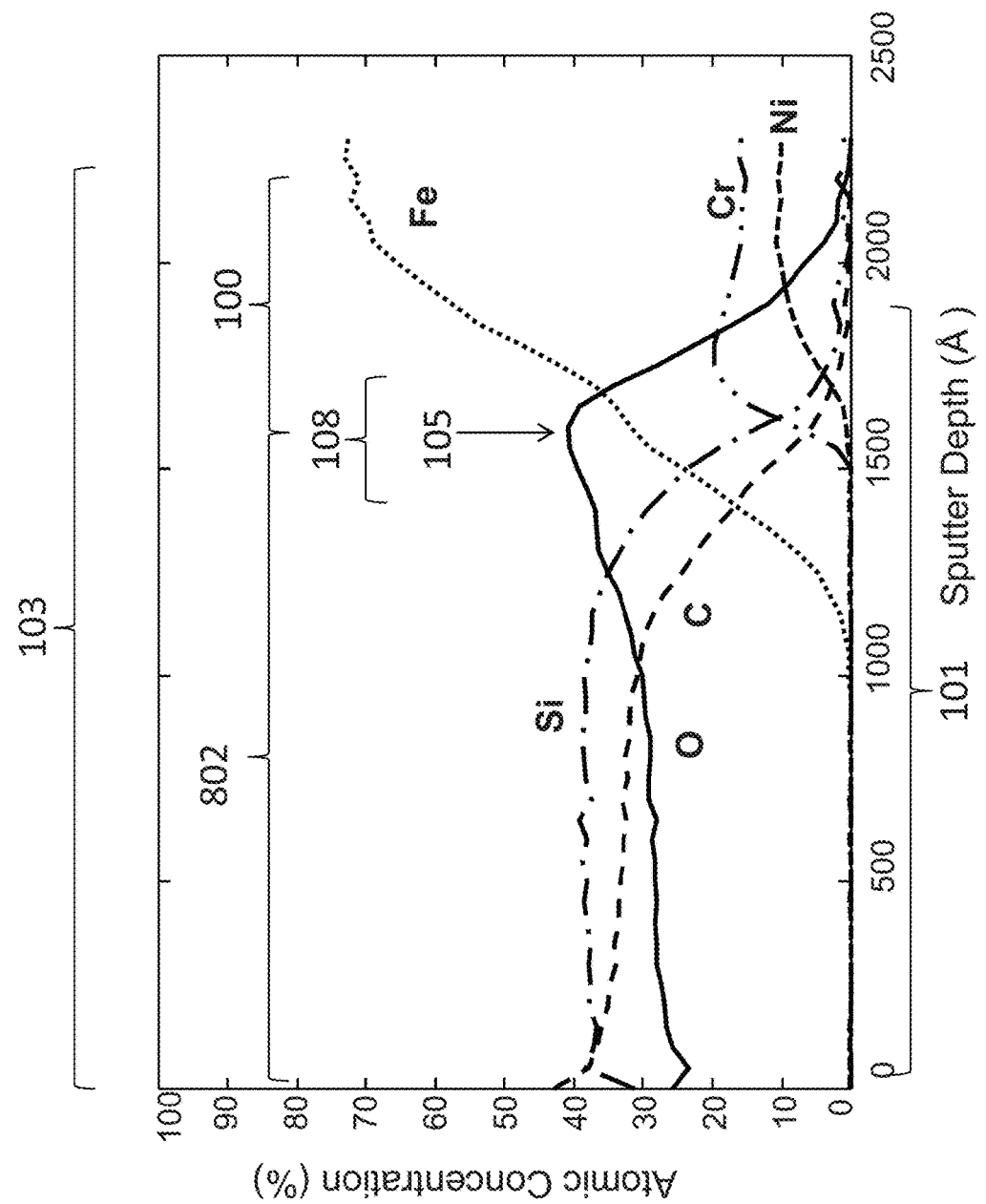
FIG. 11 shows an Auger Electron Spectroscopy plot for an exemplary embodiment of a coating having a water oxidized layer on a substrate according to the disclosure.

FIG. 11 illustrates diffusion of the water oxidized layer 802 into the substrate 100 (for example, stainless steel) according to an exemplary embodiment. Specifically, FIG. 11 shows the composition of the water oxidized layer 802 within the substrate 100, the coating 101, and the article 103 by Auger Electron Spectroscopy. As shown, the oxidation is illustrated by Si—H moieties undergoing oxidation and elimination to create Si—O—Si linkages, as well as some Si—C and/or free carbon species being eliminated as well. In one embodiment, the oxidized layer 802 extends to about 1600 Angstroms and includes the diffusion region 108 being about 250 Angstroms, identifiable based upon a decreased concentration of C and Si. The range of the water oxidized layer can be between about 0.1 micrometers and about 3.0 micrometers. The diffusion region 108 can be between about 5 nanometers and 500 nanometers. The composition of the water oxidized layer 802 is about 1.0:1.22:0.91 (C:Si:O) with an increase in Oxygen due to the preexisting oxide layer on substrate 100.

Example 1

The first example included introducing dimethylsilane to the substrate 100 for 2 hours at 8 p.s.i.a. gas at 450° C. to form the layer 102. In the first example, the layer 102 was almost undetectable (i.e., very difficult to visually discern) on a mirror-polished 316 stainless steel coupon (slightly yellowed). Measurements showed water contact angle data prior to the deposition treatment at around 60°. After the deposition treatment with dimethylsilane, the contact angle increased to around 102°. Although the layer 102 was not visible, the data indicated an extremely thin deposition with a significant density of carbosilyl material on the layer 102 of the surface 105. The thickness of the layer 102 was estimated to be at about 100 Angstroms as available spectroscopic techniques were not sensitive enough to detect the coating.

Example 2

The second example included introducing dimethylsilane to the substrate 100 for 15 hours at 8 p.s.i.a. gas at 450° C. to form the layer 102. In the second example, the layer 102 had a visible luminescent rainbow array of colors. Measurements showed average deionized water contact angle data around 100°, for mirror-finished 316 stainless steel surfaces and polished silicon wafer surfaces. FT-IR indicated presence of C—H based upon a reading at 2950 cm$^{-1}$, the presence of Si—C based upon a reading at 792 cm$^{-1}$, and the presence of Si—H moieties based upon a reading at 2102 cm$^{-1}$. The thickness of the layer 102 was determined by spectrometer to be about 800 Angstroms. Further measurements utilizing Auger Electron Spectroscopy were also performed. The measurements showed increased concentrations of Si and C atoms on the layer 102. The measurement further showed the concentration of Si and C atoms decreasing upon reaching the diffusion region 108 illustrated by the increase in concentration of Fe, Cr, and Ni atoms. The measurement showed the concentration of Si and C atoms being asymptotic with zero upon reaching a point beyond the diffusion region 108. The measurement also showed that the diffusion region 108 can be identified based upon the concentration of O atoms being elevated (the result of a surface oxide on the surface 105 of the substrate 100 prior to deposition).

Example 3

The third example included introducing dimethylsilane to the substrate 100 for 15 hours at 8 p.s.i.a. gas at 450° C. to form the layer 102 and subsequently oxidizing the layer 102 of the substrate 100 with water in an inert gas for 2 hours at about 100 to 200 p.s.i.a. gas at 450° C. to form the oxidized layer 802. FT-IR data failed to reveal the significant presence of any functional moieties (Si—OH or Si—H) for surface modification chemistry. The resultant carboxysilane material revealed an improvement in hardness and wear resistance over the native carbosilane. The oxidized layer 802 had a contact angle on a Si wafer of 86.6°, and an increased presence of Si—O—Si groups.

Example 4

The fourth example included introducing dimethylsilane to the substrate 100 for 15 hours at 8 p.s.i.a. gas at 450° C.

to form the layer 102 and subsequently oxidizing the layer 102 of the substrate 100 with an oxidation reagent mixture for 2 hours at about 100 to 200 p.s.i.a. gas at 300° C. to form the oxidized layer 805. The oxidation reagent mixture included air and water. According to FT-IR data, the oxidized layer 805 had a decrease of C—H groups (in comparison to Example 3), a decrease of Si—C groups (in comparison to Example 3), and an increase of Si—OH groups (in comparison to Example 3).

Example 5

The fifth example included introducing dimethylsilane to the substrate 100 for 15 hours at 8 p.s.i.a. gas at 450° C. to form the layer 102 and subsequently oxidizing the layer 102 on the substrate 100 with air for 2 hours at about 100 to 200 p.s.i.a. gas at 300° C. to form the oxidized layer 805. The fifth example produced an oxidized carbosilane material with a significant Si—OH stretch observed in the FT-IR data (broad; 3414 cm$^{-1}$). Contact angle was measured to be 50.9° for deionized water. Electrochemical impedance spectroscopy showed impedance at low frequency $Z_{lf}$=about 7.27 kohm. Wear resistance of the material was analyzed with a Tribometer (CSM Instruments S/N 18-343) applying a 0.5 N force via a standard 100 Cr6 ball and circular linear speed of 3.00 cm/s thereby showing a 4.141e$^{-03}$ wear (mm$^3$/N m). The oxidized layer 805 had lower friction (in comparison to Example 3), higher wear resistance (in comparison to Example 3), and a presence of Si—O—Si groups.

Example 6

Figure 10:
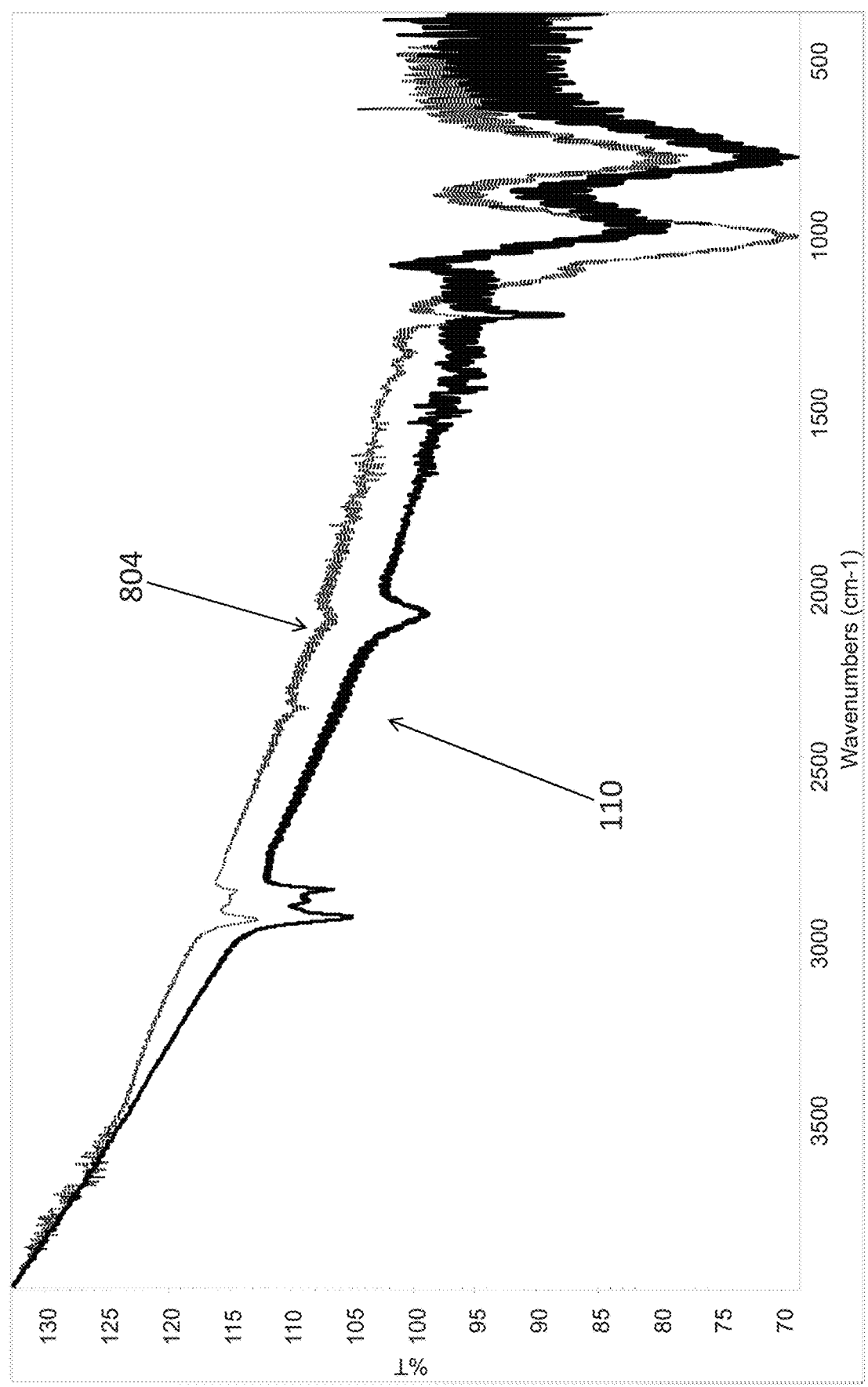
FIG. 10 shows an FT-IR plot for a dimethylsilane deposited, functionalized surface and a dimethylsilane deposited, functionalized and water oxidized surface.

The sixth example included functionalizing the layer 102 formed in Example 2 with ethylene to form the functionalized layer 110. The functionalized layer 110 had a water contact angle of 98.3° advancing and 85.1° receding. As shown in FIG. 10, FT-IR data showed little oxidation occurred based upon a lack of Si—O—Si groups (based upon a stretch at 1027 cm$^{-1}$) and decreased an amount of Si—H groups (based upon a stretch at 2091 cm$^{-1}$).

Example 7

The seventh example included functionalizing the layer 102 formed in Example 2 with ethylene to form the functionalized layer 110. Then, the functionalized layer 110 was oxidized by 5 ml deionized water (DI) being added to the chamber. The chamber was exposed to several nitrogen flushes and mild vacuum to remove air from the sealed container. The temperature in the chamber was held at 450° C. for about 2 hours and then returned to room temperature. The oxidation of the functionalized layer 110 formed the functionalized then oxidized layer 804. The functionalized then oxidized layer 804 had a water contact angle data of 95.6° advancing and 65.9° receding. As shown in FIG. 10, FT-IR showed oxidation increased an amount of Si—O—Si groups (based upon a stretch at 1027 cm$^{-1}$) and decreased an amount of Si—H groups (based upon a stretch at 2091 cm$^{-1}$) in comparison to the functionalized layer 110 formed in Example 6.

While only certain features and embodiments of the invention have been shown and described, many modifications and changes may occur to those skilled in the art (for example, variations in sizes, dimensions, structures, shapes and proportions of the various elements, values of parameters (for example, temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

What is claimed is:

1. A coated article, comprising:
   a first layer having a first atomic concentration of C, a first atomic concentration of Si, and a first atomic concentration of O, wherein the first atomic concentration of the C is greater than the first atomic concentration of the O, and the first atomic concentration of the Si is greater than the first atomic concentration of the C;
   a second layer having a first atomic concentration of Fe, a first atomic concentration of Cr, and a first atomic concentration of Ni, wherein the first atomic concentration of the Fe is greater than the first atomic concentration of the Cr, and the first atomic concentration of the Cr is greater than the first atomic concentration of the Ni; and
   a diffusion region between the first layer and the second layer, wherein the diffusion region has a second atomic concentration of the C, a second atomic concentration of the Si, a second atomic concentration of the O, a second atomic concentration of the Fe, a second atomic concentration of the Cr, and a second atomic concentration of the Ni, the second atomic concentration of the O being greater than the second atomic concentration of the C, the second atomic concentration of the Si, the second atomic concentration of the Fe, the second atomic concentration of the Cr, and the second atomic concentration of the Ni;
   wherein all of the atomic concentrations are based upon Auger Electron Spectroscopy;
   wherein the coated article further includes an oxidized layer on the first layer.

2. The coated article of claim 1, wherein the diffusion region is at least 5 nm in thickness.

3. The coated article of claim 1, wherein the diffusion region is between 5 nm and 500 nm in thickness.

4. The coated article of claim 1, wherein the diffusion region is between 20 nm and 500 nm in thickness.

5. The coated article of claim 1, wherein the diffusion region is between 5 nm and 20 nm in thickness.

6. The coated article of claim 1, wherein the first layer is greater than 100 nm in thickness.

7. The coated article of claim 1, wherein the first atomic concentration of the C is greater than 30.

8. The coated article of claim 1, wherein the first atomic concentration of the Si is greater than 30.

9. The coated article of claim 1, wherein the first atomic concentration of the O is less than 30.

10. The coated article of claim 1, wherein the second atomic concentration of the C is less than 30, the second atomic concentration of the Si is less than 35, and the second atomic concentration of the O is greater than 35.

11. The coated article of claim 1, wherein the second layer includes a third atomic concentration of C, a third atomic concentration of Si, and a third atomic concentration of 0, wherein the third atomic concentration of the C, the third atomic concentration of the Si, and the third atomic concentration of the O are less than the first concentration of the Fe.

12. The coated article of claim 1, wherein the second layer includes a third atomic concentration of C, a third atomic concentration of Si, and a third atomic concentration of O, wherein the third atomic concentration of the C, the third atomic concentration of the Si, and the third atomic concentration of the O are less than the first concentration of the Cr.

13. The coated article of claim 1, wherein the second layer includes a third atomic concentration of C and a third atomic concentration of O, wherein the third atomic concentration of the C and the third atomic concentration of the O are less than the first concentration of the Ni.

14. The coated article of claim 1, wherein the first atomic concentration of the Fe is greater than 35.

15. The coated article of claim 1, wherein the first atomic concentration of the Cr is less than 20.

16. The coated article of claim 1, wherein the first atomic concentration of the Ni is less than 15.

17. The coated article of claim 1, wherein the second layer includes a third atomic concentration of C, a third atomic concentration of Si, and a third atomic concentration of O, wherein the first atomic concentration of the Fe is greater than 35, the first atomic concentration of the Cr is less than 20, and the first atomic concentration of the Ni is less than 15.

18. A coated article, comprising:
a first layer having a first atomic concentration of C, a first atomic concentration of Si, and a first atomic concentration of O, wherein the first atomic concentration of the C is greater than the first atomic concentration of the O, and the first atomic concentration of the Si is greater than the first atomic concentration of the C;
a second layer having a first atomic concentration of Fe, a first atomic concentration of Cr, and a first atomic concentration of Ni, wherein the first atomic concentration of the Fe is greater than the first atomic concentration of the Cr, and the first atomic concentration of the Cr is greater than the first atomic concentration of the Ni; and
a diffusion region between the first layer and the second layer, wherein the diffusion region has a second atomic concentration of the C, a second atomic concentration of the Si, a second atomic concentration of the O, a second atomic concentration of the Fe, a second atomic concentration of the Cr, and a second atomic concentration of the Ni, the second atomic concentration of the O being greater than the second atomic concentration of the C, the second atomic concentration of the Si, the second atomic concentration of the Fe, the second atomic concentration of the Cr, and the second atomic concentration of the Ni;
wherein the diffusion region is at least 5 nm in thickness;
wherein the first atomic concentration of the C is greater than 30, the first atomic concentration of the Si is greater than 30, the first atomic concentration of the O is less than 30, the second atomic concentration of the C is less than 30, the second atomic concentration of the Si is less than 35, and the second atomic concentration of the O is greater than 35;
wherein all of the atomic concentrations are based upon Auger Electron Spectroscopy;
wherein the coated article further includes an oxidized layer on the first layer.

19. A coated article, comprising:
a first layer having a first atomic concentration of C, a first atomic concentration of Si, and a first atomic concentration of O;
a second layer having a first atomic concentration of Fe, a first atomic concentration of Cr, and a first atomic concentration of Ni; and
a diffusion region between the first layer and the second layer, wherein the diffusion region has a second atomic concentration of the C, a second atomic concentration of the Si, a second atomic concentration of the O, a second atomic concentration of the Fe, a second atomic concentration of the Cr, and a second atomic concentration of the Ni;
wherein the first atomic concentration of the C is greater than 30, the first atomic concentration of the Si is greater than 30, the first atomic concentration of the O is less than 30, the second atomic concentration of the C is less than 30, the second atomic concentration of the Si is less than 35, and the second atomic concentration of the O is greater than 35;
wherein all of the atomic concentrations are based upon Auger Electron Spectroscopy;
wherein the coated article further includes an oxidized layer on the first layer.

20. The coated article of claim 1, wherein the coated article includes a functionalized layer on the oxidized layer.

* * * * *